(12) United States Patent
Zhao et al.

(10) Patent No.: US 11,538,406 B2
(45) Date of Patent: Dec. 27, 2022

(54) DISPLAY SUBSTRATE, DISPLAY PANEL AND SPLICED SCREEN

(71) Applicant: BOE TECHNOLOGY GROUP CO., LTD., Beijing (CN)

(72) Inventors: Jiao Zhao, Beijing (CN); Li Xiao, Beijing (CN); Minghua Xuan, Beijing (CN); Haoliang Zheng, Beijing (CN); Dongni Liu, Beijing (CN); Jing Liu, Beijing (CN); Qi Qi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/254,069

(22) PCT Filed: Nov. 28, 2019

(86) PCT No.: PCT/CN2019/121645
§ 371 (c)(1),
(2) Date: Dec. 18, 2020

(87) PCT Pub. No.: WO2021/102810
PCT Pub. Date: Jun. 3, 2021

(65) Prior Publication Data
US 2021/0366378 A1 Nov. 25, 2021

(51) Int. Cl.
*G09G 3/3225* (2016.01)
*G09F 9/302* (2006.01)

(52) U.S. Cl.
CPC .......... *G09G 3/3225* (2013.01); *G09F 9/302* (2013.01)

(58) Field of Classification Search
CPC ........ G09G 2300/023–026; G09G 3/30–3291; G09G 3/035; G09G 2380/02
See application file for complete search history.

(56) References Cited

U.S. PATENT DOCUMENTS

2016/0035812 A1    2/2016  Kwon et al.
2017/0077447 A1*   3/2017  Kang ............... H01L 51/5237
(Continued)

FOREIGN PATENT DOCUMENTS

CN    104090405 A    10/2014
CN    106098710 A    11/2016
(Continued)

OTHER PUBLICATIONS

First Office Action dated Apr. 24, 2022 corresponding to Chinese application No. 201980002629.0.

*Primary Examiner* — Hang Lin
(74) *Attorney, Agent, or Firm* — Nath, Goldberg & Meyer; Joshua B. Goldberg (57) ABSTRACT

The present application provides a display substrate, a display panel and a spliced screen, and belongs to the field of display technology. The display substrate in the present application is divided into display and boding regions, and includes a base substrate, and a pixel driving circuit on the base substrate and corresponding to the display region. The display substrate further includes an interlayer insulating layer and a signal lead-in wire on the base substrate. The signal lead-in wire at least includes a first signal lead-in sub-wire on a side of the interlayer insulating layer away from the base substrate. The first signal lead-in sub-wire is connected to a first connection pad in the bonding region for introducing an external signal to the pixel driving circuit. The interlayer insulating layer includes sub-insulating layers defining a multi-stepped structure at a position where the display region is adjacent to the bonding region.

20 Claims, 2 Drawing Sheets

(56) References Cited

U.S. PATENT DOCUMENTS

| | | | |
|---|---|---|---|
| 2018/0197935 A1 | 7/2018 | Yuan et al. | |
| 2019/0036073 A1* | 1/2019 | Yu | H01L 27/124 |
| 2019/0095007 A1* | 3/2019 | Jeong | H01L 27/3276 |
| 2019/0148474 A1* | 5/2019 | Bu | H01L 27/1259 |
| | | | 257/40 |
| 2020/0058728 A1* | 2/2020 | Song | H01L 27/3276 |
| 2020/0295120 A1* | 9/2020 | Bower | H01L 27/3293 |

FOREIGN PATENT DOCUMENTS

| | | |
|---|---|---|
| CN | 107180852 A | 9/2017 |
| CN | 109817675 A | 5/2019 |
| CN | 109860253 A | 6/2019 |
| CN | 109920814 A | 6/2019 |
| KR | 10-2019-0044015 A | 4/2019 |
| KR | 20190044015 A | 4/2019 |
| KR | 10-2019-0051629 A | 5/2019 |
| KR | 20190051629 A | 5/2019 |

\* cited by examiner

DISPLAY SUBSTRATE, DISPLAY PANEL AND SPLICED SCREEN

CROSS-REFERENCE TO RELATED APPLICATIONS

This is a National Phase Application filed under 35 U.S.C. 371 as a national stage of PCT/CN2019/121645, filed on Nov. 28, 2019, the content of each of which is hereby incorporated by reference in its entirety.

TECHNICAL FIELD

The present application belongs to the field of display technology, and particularly relates to a display substrate, a display panel and a spliced screen.

BACKGROUND

At present, micro light emitting diode (micro LED) display technology has developed rapidly, and has attracted science and technology workers to the research on it due to its outstanding advantages of miniature size, low power consumption, high color saturation, fast response and long service life. However, the development of high-resolution and large-size micro LED displays is hindered because mass transfer technology has not yet matured. In view of the fact that the existing mass transfer technology is applied to television-level display and giant-screen display, the seamless splicing display technology may make up for the shortcomings of the existing mass transfer technology to realize large-screen display. For realizing real seamless splicing in a micro LED spliced display screen, the signals from a front side of a display panel, such as data voltage signals, and terminal connection pads of a source driver need to be led to a back side of the display panel for integrated circuit (IC) bonding by use of side wiring technology, but a poor yield of bonding process in the side wiring technology is nowadays an important factor that restricts the rapid development of the micro LED spliced display screen.

SUMMARY

Embodiments of the present application provide a display substrate, a display panel and a spliced screen.

In a first aspect, the embodiments of the present application provide a display substrate which is divided into a display region and a bonding region; the display substrate includes a base substrate, and a pixel driving circuit disposed on the base substrate and corresponding to the display region; and the display substrate further includes an interlayer insulating layer and a signal lead-in wire disposed on the base substrate;

the signal lead-in wire at least includes a first signal lead-in sub-wire located on a side of the interlayer insulating layer away from the base substrate; the first signal lead-in sub-wire is connected to a first connection pad in the bonding region and configured to introduce an external signal to the pixel driving circuit; and the interlayer insulating layer includes a plurality of sub-insulating layers, which define a multi-stepped structure at a position where the display region is adjacent to the bonding region.

The pixel driving circuit at least includes a switching transistor, a driving transistor, and a data line connected to a first electrode of the switching transistor, which are disposed on the base substrate. The interlayer insulating layer includes four sub-insulating layers sequentially disposed on a side of the data line away from the base substrate, the four sub-insulating layers being a first sub-insulating layer, a second sub-insulating layer, a third sub-insulating layer and a fourth sub-insulating layer;

the first and third sub-insulating layers are located only in the display region; an orthographic projection of an edge of the third sub-insulating layer adjacent to the bonding region on the base substrate is defined within an orthographic projection of the first sub-insulating layer on the base substrate, and the edge of the third sub-insulating layer adjacent to the bonding region is away from an edge of the first sub-insulating layer adjacent to the bonding region by a distance; and the first signal lead-in sub-wire is disposed on a side of the third sub-insulating layer away from the base substrate; the signal lead-in wire further includes a second signal lead-in sub-wire located in the display region; the second signal lead-in sub-wire is located between the second sub-insulating layer and the third sub-insulating layer and is connected to the data line through a first via penetrating the first and second sub-insulating layers; and the first signal lead-in sub-wire is connected to the second signal lead-in sub-wire through a second via penetrating the third and fourth sub-insulating layers.

In some embodiments, the pixel driving circuit further includes: a first spacer and a second space disposed on a side of the fourth sub-insulating layer away from the base substrate, and a first connection electrode between the second sub-insulating layer and the third sub-insulating layer; the first connection electrode is connected to a first electrode of the driving transistor through a third via penetrating the first and second sub-insulating layers, and is also connected to the first spacer through a fourth via penetrating the third and fourth sub-insulating layers; the first spacer is connected to a first electrode of a light emitting device; and the second spacer is connected to a second electrode of the light emitting device.

In some embodiments, the pixel driving circuit at least includes a switching transistor, a driving transistor, and a data line connected to a first electrode of the switching transistor, which are disposed on the base substrate; and the interlayer insulating layer includes four sub-insulating layers sequentially disposed on a side of the data line away from the base substrate, the four sub-insulating layers being a first sub-insulating layer, a second sub-insulating layer, a third sub-insulating layer and a fourth sub-insulating layer;

the first and third sub-insulating layers are located only in the display region; an orthographic projection of an edge of the third sub-insulating layer adjacent to the bonding region on the base substrate is defined within an orthographic projection of the first sub-insulating layer on the base substrate, and the edge of the third sub-insulating layer adjacent to the bonding region is away from an edge of the first sub-insulating layer adjacent to the bonding region by a distance; and the pixel driving circuit further includes: a first spacer and a second spacer disposed on a side of the fourth sub-insulating layer away from the base substrate, and a first connection electrode disposed between the second sub-insulating layer and the third sub-insulating layer; the first connection electrode is connected to a first electrode of the driving transistor through a third via penetrating the first and second sub-insulating layers, and is also connected to the first spacer through a fourth via penetrating the third and fourth sub-insulating layers; the first spacer is connected to a first electrode of a light emitting device; the second spacer is connected to a second electrode of the light emitting device; and the first signal lead-in sub-wire is connected to the second spacer.

In some embodiments, the first signal lead-in sub-wire, the first spacer and the second spacer are disposed on a same layer and are made of a same material.

In some embodiments, a first conductive pattern is stacked on a side of the first spacer away from the base substrate, and is configured to connect the first spacer to the first electrode of the light emitting device; and a second conductive pattern is stacked on a side of the second spacer away from the base substrate, and is configured to connect the second spacer to the second electrode of the light emitting device.

In some embodiments, the display substrate further includes a pixel defining layer located on a side of the first spacer and the second spacer away from the base substrate; and the pixel defining layer is provided therein with an accommodating portion, which is configured to accommodate the light emitting device, allow the first electrode of the light emitting device to be electrically connected to the first spacer, and allow the second electrode of the light emitting device to be electrically connected to the second spacer.

In some embodiments, a material of the pixel defining layer includes a black resin material.

In some embodiments, a reflective layer is further disposed on a side of the pixel defining layer away from the base substrate, and is configured to reflect light emitted from the light emitting device.

In some embodiments, in the bonding region, a first connection pad is disposed on a side of the first signal lead-in sub-wire away from the base substrate, a second connection pad is disposed on a side of the base substrate away from the pixel driving circuit, and the first connection pad is electrically connected to the second connection pad through a side wire.

In some embodiments, the display substrate further includes a protective layer disposed on a side of the side wire away from the base substrate.

In some embodiments, a material of the protective layer includes a black resin material.

In some embodiments, the display substrate further includes a light emitting device connected to the pixel driving circuit; and the light emitting device includes an inorganic micro light emitting diode.

In some embodiments, the bonding region is located on at least one side of the display region.

In a second aspect, the embodiments of the present application provide a display panel, including the above display substrate.

In a third aspect, the embodiments of the present application provide a spliced screen, which is formed by splicing a plurality of the above display panels.

DETAILED DESCRIPTION

In order to enable those skilled in the art to better understand the technical solutions of the present application, the present application is described below in detail with reference to the accompanying drawings and the specific embodiments.

Unless otherwise defined, technical terms or scientific terms used in the present disclosure should have general meanings that can be understood by people with ordinary skills in the technical field of the present disclosure. The words "first", "second" and the like used in the present disclosure are not intended to indicate any order, quantity, or importance, but are used merely to distinguish between different components. Similarly, the words "a", "an", "the" and the like do not denote limitation to quantity, but denote "at least one". The words "include", "comprise" and the like indicate that an element or object before the words covers elements or objects or the equivalents thereof listed after the words, but do not exclude other elements or objects. The words "connect", "couple" and the like are not restricted to physical or mechanical connection, but may include electrical connection, whether direct or indirect. The words "on", "under", "left", "right" and the like are used merely to indicate relative positional relationships, and when an absolute position of an object described is changed, the relative positional relationships may also be changed accordingly.

Figure 1:
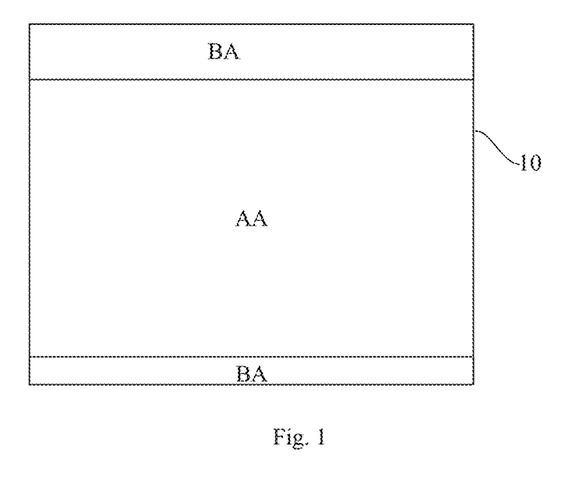
FIG. 1 is a schematic diagram illustrating regions of a display substrate according to the embodiments of the present application.

In order to clarify a specific structure of a display substrate in the embodiments of the present application, firstly, FIG. 1 shows a schematic diagram illustrating distribution of all regions of an exemplary display substrate. The display substrate includes a display region AA, and a bonding region BA located on at least one side of the display substrate. As shown in FIG. 1, the display region AA is located in a middle region of the display substrate, and the bonding region BA is located on upper and lower sides of the display substrate. The bonding region BA on the upper side of the display substrate is provided with a first pad and a second pad which are configured to provide a data voltage signal for a pixel unit disposed in the display region AA, the first pad is located on a first surface of a base substrate 10 of the display substrate, and the second pad is located on a second surface of the base substrate 10. The bonding region BA on the lower side of the display substrate is provided with a first pad and a second pad which are configured to provide a power supply voltage signal for a shift register in the display region AA, the power supply voltage signal includes a high power voltage VDD and a low power voltage VSS, the first pad is located on the first surface of the base substrate of the display substrate, and the second pad is located on the second surface of the base substrate. The structure of the bonding region BA that is configured to provide the data voltage signal for the pixel unit disposed in the display region AA is explained in the following embodiments of the present application. The connection relationship between the first pad and the second pad is described below.

Figure 2:
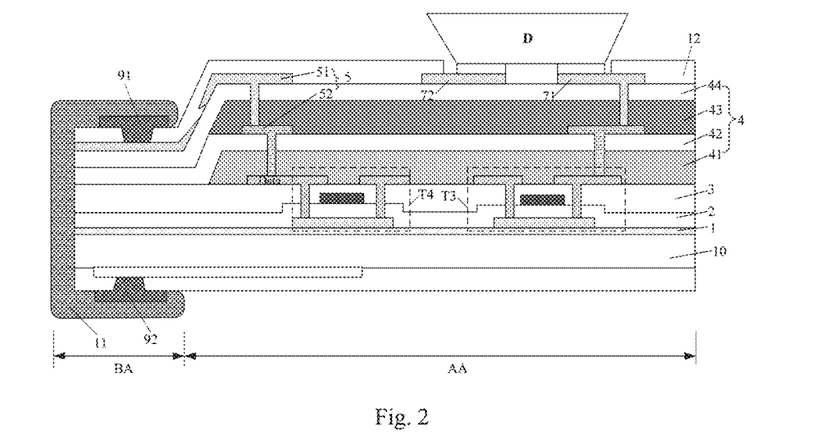
FIG. 2 is a schematic diagram of a display substrate according to the embodiments of the present application.
Figure 3:
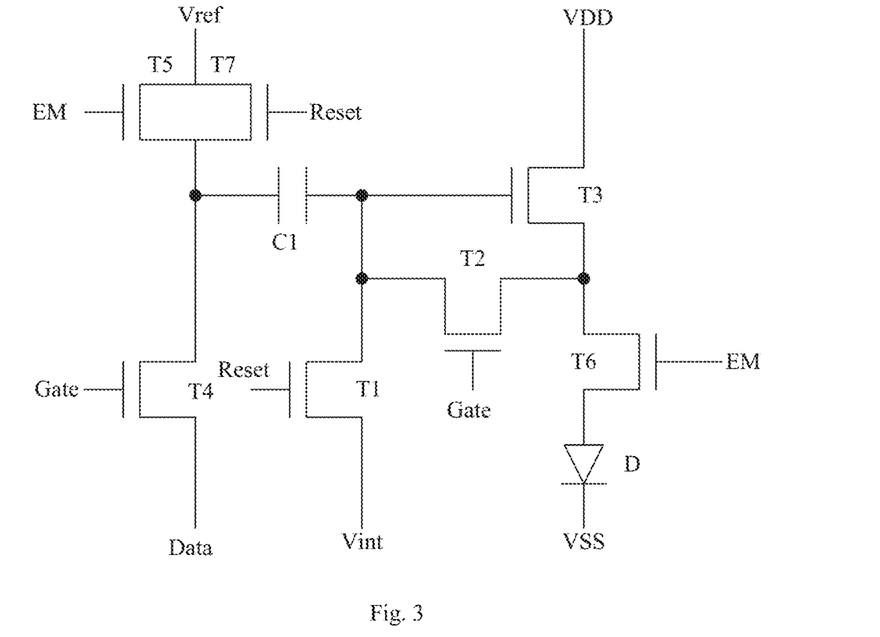
FIG. 3 is a schematic diagram of a pixel circuit in a display substrate according to the embodiments of the present application.

As shown in FIG. 2, a structure of an exemplary display substrate is provided for better understanding of a display substrate in the embodiments of the present application. It should be understood that the display substrate does not constitute a limitation on the scope of the embodiments of the present application. The display substrate is divided into a display region AA and a bonding region BA; the bonding region BA is located on one side of the display region AA, for example, as shown in FIG. 1, the bonding region BA is located on the left side of the display region AA; in the display region AA, a pixel circuit is disposed on a base substrate 10; in the bonding region BA, a first connection pad 91 is disposed on the base substrate 10, a second connection pad 92 is disposed on one side of the base substrate away from the first connection pad, the first connection pad 91 and the second connection pad 92 are connected to each other through a side wire 11 located on a side surface of the base substrate 10, a third connection pad (not shown) is further disposed one the same layer as the second connection pad on the base substrate 10, the third connection pad and the second connection pad are connected to each other through a fanout wire, and an IC is bonded to the third connection pad; and the first connection pad 91 is connected to the pixel circuit through a signal lead-in wire to transmit an external signal supplied by the IC to the pixel circuit. The pixel circuit generally includes a pixel driving circuit and a light emitting device. The pixel driving circuit at least includes a switching transistor and a driving transistor, and may further include a threshold compensation transistor, a storage capacitor and the like. As shown in FIG. 3, an exemplary pixel circuit is provided. The pixel circuit specifically includes a first reset transistor T1, a threshold compensation transistor T2, a driving transistor T3, a switching transistor T4, a first emission control transistor T5, a second emission control transistor T6, a second reset transistor T7, a first storage capacitor C1, and a light emitting device D; a first electrode of the first reset transistor T1 is connected to an initial voltage signal terminal Vint, a second electrode of the first reset transistor T1 is connected to a second terminal of the first storage capacitor C1, a first electrode of the threshold compensation transistor T2 and a control electrode of the driving transistor T3, and a control electrode of the first reset transistor T1 is connected to a reset signal terminal Reset; a second electrode of the threshold compensation transistor T2 is connected to a second electrode of the driving transistor T3 and a first electrode of the second emission control transistor T6, and a control electrode of the threshold compensation transistor T2 is connected to a gate line Gate; a first electrode of the driving transistor T3 is connected to a first power supply voltage terminal VD; a first electrode of the switching transistor T4 is connected to a data line Data, and a second electrode of the switching transistor T4 is connected to a second electrode of the first emission control transistor T5, a second electrode of the second reset transistor T7 and a first electrode of the first storage capacitor C1; a control electrode of the switching transistor T4 is connected to the gate line; a first electrode of the first emission control transistor T5 is connected to a reference voltage signal terminal Vref, and a control electrode of the first emission control transistor T5 is connected to an emission control line EM; a second electrode of the second emission control transistor T6 is connected to a first electrode of the light emitting device D, and a control electrode of the second emission control transistor T6 is connected to the emission control line EM; and a first electrode of the second reset transistor T7 is connected to the reference voltage signal terminal Vref, a control electrode of the second reset transistor T7 is connected to the reset signal terminal Reset, and a second electrode of the light-emitting device is connected to a second power supply voltage terminal VSS.

The above transistors adopted in the present application may be thin film transistors or field effect transistors or other devices with the same characteristics. Since a source electrode and a drain electrode of the adopted transistor are symmetrical, there is no difference between the source electrode and the drain electrode. In the embodiments of the present application, for distinguishing between the source electrode and the drain electrode of the transistor, one of the source electrode and the drain electrode is referred to as a first electrode, the other is referred to as a second electrode, and a gate electrode of the transistor is referred to as a control electrode. In addition, the transistors may be divided into N-type transistors and P-type transistors according to the characteristics of the transistors. In the case where the P-type transistor is adopted, the first electrode is the source electrode of the P-type transistor, the second electrode is the drain electrode of the P-type transistor, and the P-type transistor is turned on when a low level is input to the gate electrode; and in the case where the N-type transistor is adopted, the first electrode is the source electrode of the N-type transistor, the second electrode is the drain electrode of the N-type transistor, and the N-type transistor is turned on when a high level is input to the gate electrode. As an example, the above-described transistors in the pixel circuit are all N-type transistors. But it is readily envisaged by those skilled in the art without creative efforts that the P-type transistors may be used in the above pixel circuit, and therefore, the use of the P-type transistors also falls within the scope of the embodiments of the present application.

The positional relationship of all the layers shown in a sectional view of the display substrate in FIG. 2 is explained below, but only some elements such as the switching transistor T4 and the driving transistor T3 are illustrated in FIG. 2. As an example, the switching transistor T4 and the driving transistor T3 are top-gate thin film transistors in the description below.

The display substrate includes: a base substrate 10, and a buffer layer 1 on the base substrate 10; an active layer of the switching transistor T4 and an active layer of the driving transistor T3 disposed on the same layer and on the buffer layer 1; a gate insulating layer 2 on the layer where the active layer of the switching transistor T4 and the active layer of the driving transistor T3 are located, the gate insulating layer 2 covering the display region AA and the bonding region BA; a gate electrode of the switching transistor T4 and a gate electrode of the driving transistor T3 disposed on the same layer and on the gate insulating layer 2; a first insulating layer 3 on the layer where the gate electrode of the switching transistor T4 and the gate electrode of the driving transistor T3 are located, the first insulating layer 3 covering the display region AA and the bonding region BA; a source electrode and a drain electrode of the switching transistor T4, a source electrode and a drain electrode of the driving transistor T3, and a data line connected to the source electrode of the switching transistor T4, which are disposed on the same layer and on the first insulating layer 3; a first planarization layer 41 on the layer where the source electrode and the drain electrode of the switching transistor T4, the source electrode and the drain electrode of the driving transistor T3, and the data line connected to the source electrode of the switching transistor T4 are located, the first planarization layer 41 being located only in the display region AA; a first passivation layer 42 on the first planarization layer 41, the first passivation layer 42 covering the display region AA and the bonding region BA; a second signal lead-in sub-wire 52 and a first connection electrode 6 disposed on the same layer and on the first planarization layer 41, the second signal lead-in sub-wire 52 being connected to the data line through a first via penetrating the first planarization layer 41 and the first passivation layer 42, and the first connection electrode 6 being connected to the drain electrode of the driving transistor T3 through a third via penetrating the first planarization layer 41 and the first passivation layer 42; a second planarization layer 43 on the layer where the second signal lead-in sub-wire 52 and the first connection electrode 6 are located, the second planarization layer 43 being located only in the display region AA; a second passivation layer 44 on the second planarization layer 43, the second passivation layer 44 covering the display region AA and the bonding region BA; a first signal lead-in sub-wire 51, a first spacer 71, and a second spacer 72 which are disposed on the same layer and on the second passivation layer 44, the first signal lead-in sub-wire 51 extending from the display region AA to the bonding region BA and being connected to the second signal lead-in sub-wire 52 through a second via penetrating the second planarization layer 43 and the second passivation layer 44, and the first spacer 71 being connected to the first connection electrode 6 through a fourth via penetrating the second planarization layer 43 and the second passivation layer 44; a third passivation layer 12 on the first signal lead-in sub-wire 51, the first spacer 71, and the second spacer 72, the third passivation layer 12 covering the display region AA and the bonding region BA; a first connection pad 91 on the third passivation layer 12 in the bonding region BA, the first connection pad 91 being connected to the first signal lead-in sub-wire 51 through a fifth via penetrating the third passivation layer 12; and a light emitting device D having a first electrode connected to the first spacer 71 through a sixth via penetrating the third passivation layer 12, and a second electrode connected to the second spacer 72 through a seventh via penetrating the third passivation layer 12.

The light emitting device D may be an inorganic micro light emitting diode, and further, may be a current-type light emitting diode, such as a micro light emitting diode (micro LED) or a mini light emitting diode (mini LED). The light emitting device D in the embodiments of the present application may also be an organic light emitting diode (OLED). One of the first electrode and the second electrode of the light emitting device D is an anode and the other is a cathode. In the description of the embodiments of the present application, as an example, the first electrode of the light emitting device D is an anode, and the second electrode of the light emitting deice D is a cathode.

The thickness of the buffer layer 1, the gate insulating layer 2 and the first insulating layer 3 are in a range of 0.1 µm to 0.2 µm.

Since the first planarization layer 41 and the second planarization layer 43 are used to ensure flatness of layers, the first planarization layer 41 and the second planarization layer 43 each are thicker than the first passivation layer 42 or the second passivation layer 44. Specifically, the thicknesses of the first planarization layer 41 and the second planarization layer 43 are generally in a range of 2 µm to 2.5 µm; and the thicknesses of the first passivation layer 42 and the second passivation layer 44 are generally in a range of 0.1 µm to 0.2 µm.

In the related art, regardless of a trend of light and thin display substrates, there is no design requirement of disposing a plurality layers of metal wires in the manufacturing process of an LCD display substrate, that is, the display substrate is not provided therein with a plurality of insulating layers, therefore, a high segment difference at the same size level of a micro LED display substrate does not exist in the LCD display substrate. A current signal required for driving a micro LED is larger in amplitude than that for driving an OLED, which makes the problem of IR drop of a wiring structure on the display substrate more significant.

In order to solve the problem, there is a need to reduce wire resistance and connect the plurality of metal wires in parallel. However, in the side wiring process, if there are a plurality of layers between the first connection pad 91 and the second connection pad 92 on the display substrate and the plurality of layers are relatively thick, directly connecting the first connection pad to the second connection pad will increase the difficulty of the process, that is, a metal connection layer which wraps the edge of the base substrate 10 is easily broken, so that a yield of bonding process is reduced. But the micro LED display substrate must be provided with two or more layers of metal wires (for example, the first signal lead-in sub-wire 51 and the second signal lead-in sub-wire 52) that serve as cathode and anode signal lead-in wires of the micro LED, and moreover, two thicker insulating layers (for example, the first planarization layer 41 and the second planarization layer 43) are added between the metal wires in order to reduce the mutual influence of the parasitic capacitance of two layers of metal wires. In order to reduce the thickness of the bonding region BA, prevent the metal connection layer from being broken in the side wiring process and reduce the difficulty of the process, the first planarization layer 41 and the second planarization layer 43, which are two organic layers, need to be removed by exposing and developing in the bonding region BA; in the meantime, however, there is a risk that the signal lead-in wire 5 in the display region AA may be broken, that is, the first signal lead-in sub-wire 51 of the signal lead-in wire 5 as shown in FIG. 2 may be broken.

It should be noted that the source electrode of the driving transistor 4 needs to be connected to the first spacer 71 through the connection electrode 6 when the micro LED is bonded, so as to ensure that the first spacer 71 and the second spacer 72 are on the same plane to facilitate the bonding of a cathode and an anode of the micro LED.

To solve the above technical problem, the embodiments of the present application provide the following technical solutions for preventing the signal lead-in wire from being broken.

It should be noted that, in the following embodiments, as an example, a first sub-insulating layer, a second sub-insulating layer, a third sub-insulating layer, and a fourth sub-insulating layer of an interlayer insulating layer 4 are the first planarization layer 41, the first passivation layer 42, the second planarization layer 43, and the second passivation layer 44, respectively. It should be understood that the interlayer insulating layer 4 is not limited to the structure including only four sub-insulating layer structures, and thus, the above structure of the interlayer insulating layer 4 does not constitute a limitation on the scope of the embodiments of the present application.

Figure 4:
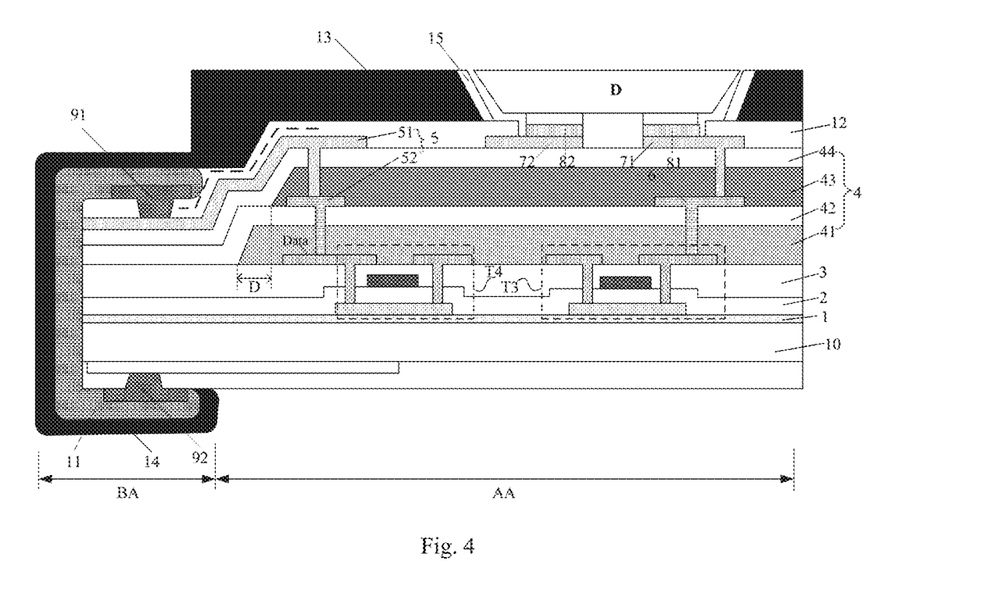
FIG. 4 is a schematic diagram of another display substrate according to the embodiments of the present application.

In a first aspect, as shown in FIG. 4, the embodiments of the present application provide a display substrate which is divided into a display region AA and a bonding region BA; the display substrate includes a base substrate 10, and a pixel driving circuit disposed on the base substrate 10 and corresponding to the display region AA; the display substrate further includes an interlayer insulating layer 4 and a signal lead-in wire disposed on the base substrate 10; the signal lead-in wire includes at least a first signal lead-in sub-wire 51 located on a side of the interlayer insulating layer 4 away from the base substrate 10; the first signal lead-in sub-wire is connected to a first connection pad 91 in the bonding region BA and configured to introduce an external signal to the pixel driving circuit; and the interlayer insulating layer 4 includes a plurality of sub-insulating layers which define a multi-stepped structure (shown by a dotted line in FIG. 4) at a position where the display region AA is adjacent to the bonding region BA.

In the embodiments of the present application, by defining the multi-stepped structure with the plurality of sub-insulating layers at the position where the display region AA is adjacent to the bonding region BA, "one step" between the display region AA and the bonding region BA may be divided into "a plurality of steps", so that the risk of the breakage of the first signal lead-in sub-wire 51 extending from the display region AA to the bonding region BA is reduced, and the yield of bonding process of the display substrate is improved.

In an example of the embodiments of the present application, most structures of a display substrate are similar to the structures of the above display substrate, and thus detailed layer arrangement will not be repeated here. However, a signal lead-in wire 5 is configured to provide a data voltage signal for a data line Data, and not only includes a first signal lead-in sub-wire 51, but also include a second signal lead-in sub-wire 52 that is connected to the data line through a first via penetrating a first planarization layer 41 and a first passivation layer 42; the first signal lead-in sub-wire 51 is connected to the second signal lead-in sub-wire 52 through a second via penetrating a second planarization layer 43 and a second passivation layer 44; and the first signal lead-in sub-wire extends from a display region AA to a bonding region BA and is configured to provide a data voltage signal for the data line.

In some embodiments, as shown in FIG. 4, an orthographic projection of an edge of the second planarization layer 43 adjacent to the bonding region BA on the base substrate 10 is defined within an orthographic projection of the first planarization layer 41 on the base substrate 10, and the edge of the second planarization layer 43 adjacent to the bonding region BA is away from an edge of the second planarization layer 43 adjacent to the bonding region BA by a distance D, which is in a range of 3µm to 5µm. In this way, the first passivation layer 42 may include a surface conformal to the first planarization layer 41 after being disposed on and covering the first planarization layer 41; and since the second planarization layer 43 is formed on the first passivation layer 42 and there is the distance D between the edge of the second planarization layer 43 adjacent to the bonding region BA and the edge of the first planarization layer 41 adjacent to the bonding region BA, the first planarization layer 41, the first passivation layer 42, the second planarization layer 43 and the second passivation layer 44 may form a two-step structure at the position where the display region AA is adjacent to the bonding region BA after the second passivation layer 44 is disposed on and covers the second planarization layer 43. Then, when being disposed on the second passivation layer 44, the first signal lead-in sub-wire may extend to the bonding region BA after passing through the two-step structure. In such case, the two-step structure has a buffering effect on the first signal lead-in sub-wire to some extent, so that the risk of the breakage of the first signal lead-in sub-wire is greatly reduced.

On the basis of the above structure, the edge of the first planarization layer 41 adjacent to the bonding region BA may be processed, for example, a stepped structure may be formed on the edge of the first planarization layer 41 adjacent to the bonding region BA through a half exposure process. Similarly, a stepped structure may also be formed on the edge of the second planarization layer 43 adjacent to the bonding region BA. In this way, a multi-stepped structure with more steps may be formed to further reduce the risk of the breakage of the first signal lead-in sub-wire 51.

In some embodiments, the display substrate further includes a third signal lead-in sub-wire (not shown) disposed on the same layer as the first signal lead-in sub-wire 51, and the third signal lead-in sub-wire is connected to the second spacer 72 and extends to the bonding region BA to be bonded to a first connection pad 91 in the bonding region BA; and a cathode voltage signal introduced by the first connection pad 91 is transmitted to a cathode of the light emitting device D through the third signal lead-in sub-wire and the second spacer 72. It should be understood that the first connection pad 91 bonded to the first signal lead-in sub-wire 51 and the first connection pad 91 bonded to the third signal lead-in wire are not the same connection pad.

In an example of the embodiments of the present application, most structures of a display substrate are similar to the structures of the above display substrate, and thus detailed layer arrangement will not be repeated here. However, a signal lead-in wire 5 is configured to provide a cathode voltage signal for a cathode of the light emitting device D, and only includes a first signal lead-in sub-wire 51 which is connected to a second spacer 72 and extends to a bonding region BA to be bonded to a first connection pad 91 in the bonding region BA; and the cathode voltage signal introduced by the first connection pad 91 is transmitted to the cathode of the light emitting device D through the first signal lead-in sub-wire 51 and the second spacer 72. The structures of the first planarization layer 41, the first passivation layer 42, the second planarization layer 43, and the second passivation layer 44 are the same as the above structures, and thus will not be repeatedly described here.

In some embodiments, the above first signal lead-in sub-wire 51, the first spacer 71 and the second spacer 72 may be disposed on the same layer and made of the same material, so that the first signal lead-in sub-wire 51, the first spacer 71 and the second spacer 72 may be formed by a single patterning process, which may improve production efficiency and reduce production cost.

In some embodiments, a third passivation layer 12 is further disposed on the layer where the first signal lead-in sub-wire 51, the first spacer 71 and the second spacer 72 are located, and the parts of the third passivation layer 12 corresponding to the first spacer 71 and the second spacer 72 are patterned to expose the first spacer 71 and the second spacer 72; and a first conductive pattern 81 and a second conductive pattern 82 are disposed on the third passivation layer 12, the first conductive pattern 81 corresponds to the first spacer 71 and is electrically connected to the first spacer 71 to ensure good electrical connection between the first spacer 71 and the anode of the light emitting device D, and the second conductive pattern 82 corresponds to the second spacer 72 and is electrically connected to the second spacer 72 to ensure good electrical connection between the second spacer 72 and the cathode of the light emitting device D. The thicknesses of the first conductive pattern 81 and the second conductive pattern 82 are in a range of 0.8 µm to 1 µm.

In some embodiments, a pixel defining layer 13 is further disposed on the layer where the first conductive pattern 81 and the second conductive pattern 82 are located; and the pixel defining layer 13 is provided therein with an accommodating portion, which is configured to accommodate the light emitting device D, allow the anode of the light emitting device D to be electrically connected to the first spacer 71 through the first conductive pattern 81, and allow the cathode of the light emitting device D to be electrically connected to the second spacer 72 through the second conductive pattern 82. If thick enough, the pixel defining layer 13 may play a role in planarizing the surface of the display substrate; while if the pixel defining layer 13 is not thick enough to planarize the surface of the display substrate, a third planarization layer may be further formed on a side of the pixel defining layer 13 away from the base substrate 10 to ensure the flatness of the surface of the display substrate.

In some embodiments, a material of the pixel defining layer 13 includes, but is not limited to, a black resin material, which is adopted to prevent crosstalk of light emitted from adjacent light emitting devices D from affecting the display effect. A thickness of the pixel defining layer is in a range of 2 μm to 5 μm.

In some embodiments, a reflective layer 15 is further disposed on a sidewall of the accommodating portion of the pixel defining layer 13 and configured to reflect the light emitted from the light emitting device D to improve light extraction efficiency of the display substrate. The reflective layer 15 may be made of a material having a reflective function, such as silver.

In some embodiments, a protective layer 14 is disposed on a side of the side wire 11 away from the base substrate 10 to prevent the side wire 11 from being exposed corroded by water and oxygen. The protective layer 14 may also be made of a black resin material.

In some embodiments, the first planarization layer 41, the second planarization layer 43, and the third planarization layer may be all made of an organic resin which includes an acrylic film-forming resin, a phenolic film-forming resin, a vinyl polymer film-forming resin, or a polyimide film-forming resin.

In some embodiments, the first passivation layer 42, the second passivation layer 44, and the third passivation layer 12 may be all made of a single-layer silicon oxide material or a lamination including a plurality of sub-layers made of silicon oxide and silicon nitride.

In a second aspect, the embodiments of the present application provide a display panel which may include any one of the display substrates described above. The display panel may further include an encapsulation cover plate disposed opposite to the display substrate.

Since the display panel in the embodiments of the present application includes the above display substrate, that is, the multi-stepped structure defined by the plurality of sub-insulating layers at the position where the display region AA is adjacent to the bonding region BA, the first signal lead-in sub-wire 51 extending from the display region AA to the bonding region BA may be prevented from being broken under the buffering effect of the multi-stepped structure, which may improve the yield of bonding process of the display panel.

The display panel may be any product or component with a display function, such as a mobile phone, a tablet computer, a television, a display, a notebook computer, a digital photo frame, a navigator or the like.

In a third aspect, the embodiments of the present application further provide a spliced screen which is formed by splicing a plurality of the above display panels.

A bonding region of one of every two adjacent display panels of the spliced screen is spliced with a display region of the other, so that a width of a non-display region between the two adjacent display panels is merely equal to a width of one bonding region BA. Or, the bonding regions or the display regions of every two adjacent display panels may be spliced together, which may not affect normal display of the spliced screen because the side wires 11 in the bonding regions of the display substrate are wrapped in the protective layers 14.

It should be understood that the above embodiments are merely exemplary embodiments adopted to illustrate the principles of the present application, and the present application is not limited thereto. For those skilled in the art, various modifications and improvements may be made without departing from the spirit and scope of the present application, and those modifications and improvements should be considered to fall within the scope of the present application.

What is claimed is:

1. A display substrate divided into a display region and a bonding region, the display substrate comprising:
    a base substrate; and
    a pixel driving circuit on the base substrate and corresponding to the display region,
    wherein the display substrate further comprises an interlayer insulating layer and a signal lead-in wire on the base substrate,
    the signal lead-in wire at least comprises a first signal lead-in sub-wire on a side of the interlayer insulating layer away from the base substrate, the first signal lead-in sub-wire being connected to a first connection pad in the bonding region and configured to introduce an external signal to the pixel driving circuit, and
    the interlayer insulating layer comprises a plurality of sub-insulating layers defining a multi-stepped structure at a position where the display region is adjacent to the bonding region, such that the interlayer insulating layer has a multi-stepped outer profile at an interface between the bonding region and the display region, and the first signal lead-in sub-wire is formed conformally along the multi-stepped outer profile,
    wherein the interlayer insulating layer comprises four sub-insulating layers sequentially on a side of the data line away from the base substrate, the four sub-insulating layers being a first sub-insulating layer, a second sub-insulating layer, a third sub-insulating layer and a fourth sub-insulating layer, and
    the first and third sub-insulating layers are only in the display region, an orthographic projection of an edge of the third sub-insulating layer adjacent to the bonding region on the base substrate is defined within an orthographic projection of the first sub-insulating layer on the base substrate, and the edge of the third sub-insulating layer adjacent to the bonding region is away from an edge of the first sub-insulating layer adjacent to the bonding region by a distance.

2. The display substrate of claim 1, wherein the pixel driving circuit at least comprises a switching transistor, a driving transistor, and a data line connected to a first electrode of the switching transistor, which are on the base substrate,
    and
    the first signal lead-in sub-wire is on a side of the third sub-insulating layer away from the base substrate, the signal lead-in wire further comprises a second signal lead-in sub-wire in the display region, the second signal lead-in sub-wire is between the second sub-insulating layer and the third sub-insulating layer and is connected to the data line through a first via penetrating the first and second sub-insulating layers, and the first signal lead-in sub-wire is connected to the second signal lead-in sub-wire through a second via penetrating the third and fourth sub-insulating layers.

3. The display substrate of claim 2, wherein the pixel driving circuit further comprises a first spacer and a second spacer on a side of the fourth sub-insulating layer away from the base substrate, and a first connection electrode between the second sub-insulating layer and the third sub-insulating layer; the first connection electrode is connected to a first electrode of the driving transistor through a third via penetrating the first and second sub-insulating layers, and is also connected to the first spacer through a fourth via penetrating the third and fourth sub-insulating layers; the first spacer is connected to a first electrode of a light emitting device; and the second spacer is connected to a second electrode of the light emitting device.

4. The display substrate of claim 1, wherein the pixel driving circuit at least comprises a switching transistor, a driving transistor, and a data line connected to a first electrode of the switching transistor, which are on the base substrate;
and
the pixel driving circuit further comprises a first spacer and a second spacer on a side of the fourth sub-insulating layer away from the base substrate, and a first connection electrode between the second sub-insulating layer and the third sub-insulating layer; the first connection electrode is connected to a first electrode of the driving transistor through a third via penetrating the first and second sub-insulating layers, and is also connected to the first spacer through a fourth via penetrating the third and fourth sub-insulating layers; the first spacer is connected to a first electrode of a light emitting device; the second spacer is connected to a second electrode of the light emitting device; and the first signal lead-in sub-wire is connected to the second spacer.

5. The display substrate of claim 3, wherein the first signal lead-in sub-wire, the first spacer and the second spacer are on a same layer and are made of a same material.

6. The display substrate of claim 4, wherein the first signal lead-in sub-wire, the first spacer and the second spacer are on a same layer and are made of a same material.

7. The display substrate of claim 3, wherein a first conductive pattern is stacked on a side of the first spacer away from the base substrate, and is configured to connect the first spacer to the first electrode of the light emitting device; and a second conductive pattern is stacked on a side of the second spacer away from the base substrate, and is configured to connect the second spacer to the second electrode of the light emitting device.

8. The display substrate of claim 4, wherein a first conductive pattern is stacked on a side of the first spacer away from the base substrate, and is configured to connect the first spacer to the first electrode of the light emitting device; and a second conductive pattern is stacked on a side of the second spacer away from the base substrate, and is configured to connect the second spacer to the second electrode of the light emitting device.

9. The display substrate of claim 3, wherein the display substrate further comprises a pixel defining layer located on a side of the first spacer and the second spacer away from the base substrate; and the pixel defining layer is provided therein with an accommodating portion, which is configured to accommodate the light emitting device, allow the first electrode of the light emitting device to be electrically connected to the first spacer, and allow the second electrode of the light emitting device to be electrically connected to the second spacer.

10. The display substrate of claim 4, wherein the display substrate further comprises a pixel defining layer located on a side of the first spacer and the second spacer away from the base substrate; and the pixel defining layer is provided therein with an accommodating portion, which is configured to accommodate the light emitting device, allow the first electrode of the light emitting device to be electrically connected to the first spacer, and allow the second electrode of the light emitting device to be electrically connected to the second spacer.

11. The display substrate of claim 9, wherein a material of the pixel defining layer comprises a black resin material.

12. The display substrate of claim 11, wherein a reflective layer is on a sidewall of the accommodating portion of the pixel defining layer, and is configured to reflect light emitted from the light emitting device.

13. The display substrate of claim 1, wherein, in the bonding region, a first connection pad is on a side of the first signal lead-in sub-wire away from the base substrate, a second connection pad is on a side of the base substrate away from the pixel driving circuit, and the first connection pad is electrically connected to the second connection pad through a side wire.

14. The display substrate of claim 13, wherein the display substrate further comprises a protective layer on a side of the side wire away from the base substrate.

15. The display substrate of claim 14, wherein a material of the protective layer comprises a black resin material.

16. The display substrate of claim 1, wherein the display substrate further comprises a light emitting device connected to the pixel driving circuit, and the light emitting device comprises an inorganic micro light emitting diode.

17. The display substrate of claim 1, wherein the bonding region is on at least one side of the display region.

18. A display panel, comprising the display substrate of claim 1.

19. A spliced screen, comprising a plurality of the display panels spliced together, each displaying panel being the display panel of claim 18.

20. The display substrate of claim 1, wherein the pixel driving circuit at least comprises a switching transistor, a driving transistor, and a data line connected to a first electrode of the switching transistor, which are on the base substrate.

* * * * *